310-322

11/24/81 XR 4,302,695 SR

United States Patent [19]

Boyles et al.

[11] 4,302,695

[45] Nov. 24, 1981

[54] SUPPORT ARRANGEMENT FOR A FLEXIBLE SOUND GENERATING DIAPHRAGM

[75] Inventors: Robert L. Boyles, Milford; Samuel Polonsky, Monroe, both of Conn.

[73] Assignee: General Electric Company, New York, N.Y.

[21] Appl. No.: 94,965

[22] Filed: Nov. 16, 1979

[51] Int. Cl.$^{3}$ .............................................. H01L 41/08

[52] U.S. Cl. .................................... 310/324; 310/322

[58] Field of Search ............... 310/324, 322, 348, 354, 310/355, 356; 179/110 A

[56] References Cited

U.S. PATENT DOCUMENTS 3,007,013 10/1961 Paul et al. ....................... 310/322 X 3,921,016 11/1975 Livermore et al. ................. 310/324

4,056,741 11/1977 Hoerz et al. ....................... 310/322

4,063,049 12/1977 Pipitone et al. ................ 310/324 X

*Primary Examiner*—Mark O. Budd

*Attorney, Agent, or Firm*—George R. Powers; Leonard J. Platt; John F. Cullen

[57] ABSTRACT

A support arrangement for readily mounting the diaphragm of a piezoelectric transducer on a desired node ring, the diaphragm having coaxially mounted thereon a circular piezoceramic element having a diameter substantially the same as that of the node ring. A substantially rigid support member and a clamping spider have annular means thereon also having the same diameter as that of the node ring such that the periphery of the piezoceramic element acts as a guide means by cooperating with one of the annular mounting means to assure coaxial alignment of the diaphragm, the support members, and the clamping spider. The support members and the clamping spider are snapped together to rapidly and accurately provide the diaphragm mounting on the desired node ring.

4 Claims, 7 Drawing Figures

SUPPORT ARRANGEMENT FOR A FLEXIBLE SOUND GENERATING DIAPHRAGM

BACKGROUND OF THE INVENTION

1. Field of the Invention

This invention relates to a mounting arrangement for supporting a flexible sound generating diaphragm and, more particularly, to an arrangement for positioning and supporting a piezoelectric driven diaphragm on a node ring.

2. Description of the Prior Art

Piezoelectric transducers driven by a small disc of piezoceramic material bonded to a thin metal diaphragm are well known. When an appropriate electrical signal is applied to the disc, the disc changes its diameter, causing the composite structure of the piezoceramic disc and the metal diaphragm to flex accordingly from a flat shape into either a convex or concave shape. As the polarity of the electrical input signal changes, the shape of the flexible diaphragm also changes. By varying the polarity of the input signal at a particular frequency, the flexible diaphragm can be made to vibrate at the same frequency. To produce sound, some portion of the flexible diaphragm must be mounted to a fixed surface. This is typically accomplished by securing the diaphragm to an annular support surface by means of clamping or gluing. For loud sound, it is common to mount the diaphragm on a node ring of the diaphragm for the particular exciting frequency. The prior art mounting arrangements typically require careful alignment of the diaphragm and the support elements in order to assure that the diaphragm is secured on the desired node ring. In many instances the diaphragm is attached to the support member by a rubber-like cement which requires a period of time for curing.

SUMMARY OF THE INVENTION

It is therefore an object of the invention to provide a mounting arrangement for piezoelectric transducers that simplifies assembly of the transducer.

Another object of the invention is to provide a mounting arrangement for piezoelectric transducers that facilitates positioning of the flexible diaphragm such that it is supported on a desired node ring.

Yet another object is to provide an improved piezoelectric transducer assembly that can be rapidly and easily assembled with a high degree of accuracy in the positioning of the flexible diaphragm relative to its support elements.

Briefly stated, in carrying out the invention in one form, a sound generating device includes a flexible diaphragm having a central axis, a substantially rigid support member having an annular ridge projecting therefrom into contact with a first side of the diaphragm, a clamping spider contacting the other side of the diaphragm, interconnecting means between the rigid support member and said clamping spider for causing the diaphragm to be supported between the support member and the spider, and means for vibrating the diaphragm to produce sound. More particularly, the support member has an annular ridge projecting axially from the support member into contact with the diaphragm, the diameter of the annular ridge being equal to the diameter of a node circle of vibration of the diaphragm. The clamping spider has a hub portion and a plurality of resilient leg portions extending radially outwardly of the hub portion. Each of the leg portions has at least one support element projecting axially therefrom into contact with the diaphragm, the support elements being disposed in a circular array having the same diameter as the annular ridge. The interconnecting means joins the support member and each of the leg portions radially outwardly of the diaphragm, and the interconnecting means resiliently biases the leg portions toward the diaphragm to support the diaphragm between the annular ridge and the support elements.

In accordance with further aspects of the invention, the means for vibrating the diaphragm comprises a piezoelectric transducing element coaxially attached to one side of the flexible diaphragm and extending axially therefrom toward the adjacent one of the support member or the clamping spider. The piezoelectric element has a circular periphery of a diameter to closely fit within the inner diameter of the facing one of the annular ridge or the annular array of support elements. By positioning the piezoelectric element within the adjacent support ridge or array, the diaphragm is clamped on the node circle of vibration for the efficient production of sound. By a still further aspect of the invention, the interconnecting means includes an axially extending resilient projection on the radially outer end of each leg portion. Each of the resilient projections terminates in a hook portion for engaging a mating surface on the support member, the length of the resilient projections being such that the leg portions are resiliently deflected toward the diaphragm and the support member when the hook portions engage the mating surface. This arrangement assures that the flexible diaphragm is snugly supported on the selected node ring. To facilitate snap action assembly, both the support member and the hook portions have complementary cam surfaces to cause the axial projections to resiliently flex radially outwardly to permit the hook portions to pass around the outer periphery of the support member.

BRIEF DESCRIPTION OF THE DRAWINGS

While the novel features of the invention are set forth with particularity in the appended claims, the invention, both as to organization and content, will be better understood and appreciated, along with other objects and features thereof, from the following detailed description taken in connection with the drawings, in which:

DESCRIPTION OF A PREFERRED EMBODIMENT

Figure 1:
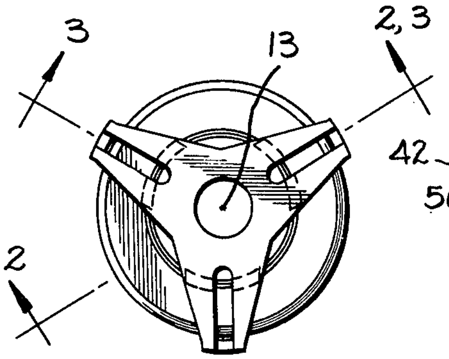
FIG. 1 is a plan view of an assembled piezoelectric transducer of this invention.
Figure 2:
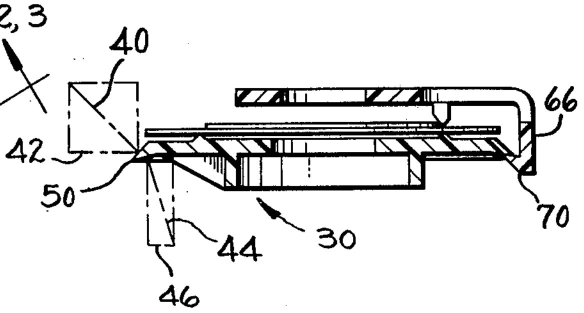
FIG. 2, is a view of the assembled transducer taken along viewing line 2—2 of FIG. 1.
Figure 3:
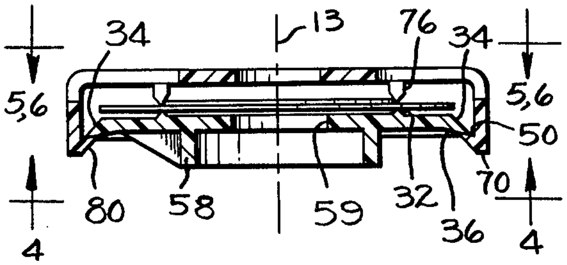
FIG. 3 is a view of the assembled transducer taken along viewing line 3—3 of FIG. 1.

Referring to the drawings and particularly to FIGS. 1, 2, 3, 6 and 7, the sound generating device of this invention includes a thin, circular flexible disc 10 of brass or the like to which a thin circular disc 12 of special piezoceramic material is bonded, the two discs being disposed on a common central axis 13 as illustrated by FIGS. 1 and 3. The piezoceramic material changes its diameter slightly when an electric signal is applied across its surfaces. More particularly, the upper exposed surface 14 has an electrical lead 16 attached thereto at junction 18, and the lower surface bonded to the metal disc or diaphragm 10 is supplied with electric potential through an electrical lead 20 attached at junction 22 to the electrically conductive metal diaphragm 10. When the voltage on the upper surface 14 is greater than the voltage on the lower surface of the disc 12, the nominal diameter "d" of the disc 12 changes by a small amount "Δ." Since the disc 12 is bonded to the flexible diaphragm 10, this change in the diameter of the disc 12 causes the diaphragm to bend from its normal flat shape to a new shape in which its upper surface becomes either convex or concave. Similarly, when the voltage applied to the junction 22 is greater than that applied to junction 18, the diameter of the ceramic disc 12 changes in the opposite sense by a small amount "Δ." This opposite change in diameter causes the diaphragm 10 to flex in the opposite direction. If the voltage applied to the terminals 18 and 22 alternates at a selected frequency "f," the diaphragm 10 will flex between convex and concave shapes at the same frequency "f." By proper mounting, the vibration of the diaphragm 10 at the selected frequency "f" can be used to produce audible sound at the frequency "f."

Figure 6:
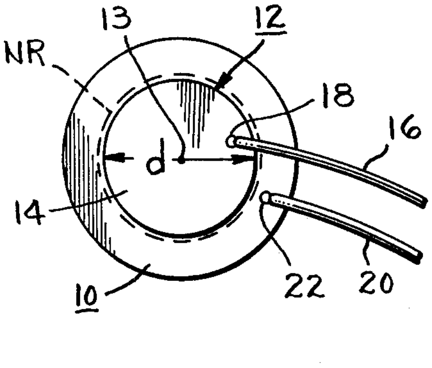
FIG. 6 is a view of the flexible diaphragm and piezoceramic element assembly only taken along viewing line 6—6 of FIG. 3.

The diaphragm 10 and disc 12 assembly have a natural node ring as indicated by the broken line "NR" of FIG. 6, the node ring NR being coaxially disposed about the central axis 13 of the flexible disc 10. The node ring "NR" is established by the physical characteristics of the diaphragm and ceramic disc assembly. To produce maximum sound output, it is desirable that the selected frequency "f" at which the diaphragm assembly is vibrated be as close as possible to the frequency which will naturally cause the assembly to flex about the node ring "NR" and that the diaphragm 10 be securely mounted on the node ring such that the diaphragm at the node ring is held stationary while the remaining portions of the diaphragm radially inside and outside of the node relative to the central axis 13 are permitted to vibrate freely at the exciting frequency. In accordance with the present invention, and for reasons which will soon become apparent, the nominal diameter "d" of the piezoceramic disc 12 is made slightly smaller than the diameter of the node ring. As a practical matter, the node ring NR and the ceramic disc 12 are coaxially located and have substantially equal diameters.

Piezoceramic transducers of the type described generally above are widely available, and the actual construction and composition of such transducers play no role in the present invention. One source of such transducers is the Piezo Product Division of Gulton Industries, Inc., located in Fullerton, California. Gulton sells such transducers under the generic description, "CATT TM tone transducers," where CATT TM means "ceramic audio tone transducers."

In accordance with the present invention, an improved mounting arrangement is provided for permitting quick and accurate assembly and support of the flexible diaphragm 10 on the node ring "NR." As shown by FIGS. 2, 3, 5 and 7, the mounting arrangement includes a support member 30 formed of plastic or the like and constructed so as to be substantially rigid. The rigid support member 30 also has a central axis and includes an annular V-shaped ridge 32 projecting axially from a first side of the support member 30, the annular ridge 32 being coaxial with the central axis and having a diameter substantially equal to the diameter of the node ring "NR" of the diaphragm 10. The support member 30 also includes a pair of annular peripheral surfaces 34 and 36 coaxial with the central axis 13. The surface 34 generally faces the same direction as the annular ridge 32, but is inclined radially outwardly such that a line normal to the surface 34 at any point (see 40 of FIG. 2) includes a radial component extending radially outwardly of the surface (see 42 of FIG. 2). The annular surface 36 generally faces in the opposite direction, and the surface 36 is inclined radially inwardly such that a line normal to the surface 36 at any point (see 44 of FIG. 2) includes a radial component extending radially inwardly of the surface (see 46 of FIG. 2) to form a V-shaped circular outer edge 50 of the support member 30. The functions of the surfaces 34 and 36 will become apparent as this description proceeds. The support member also includes an annular ring 58 to which a Helmholtz resonator, horn or the like can be attached to amplify the acoustic output of the vibrating diaphragm 10, opening 59 being provided within the annular ring 58 to permit the acoustic output to reach the ambient atmosphere through a resonator or horn attached to the ring 58.

Figure 4:
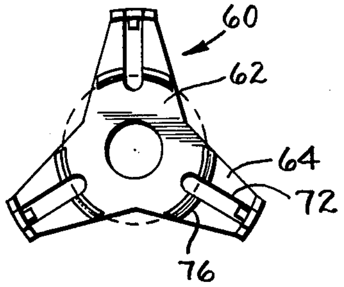
FIG. 4 is a view of the clamping spider only taken along viewing line 4—4 of FIG. 3.
Figure 5:
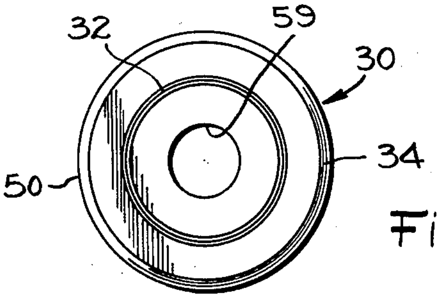
FIG. 5 is a view of the support members only taken along viewing line 5—5 of FIG. 3.

The improved mounting arrangement of this invention also includes a clamping spider 60 as best illustrated by FIGS. 1, 3, 4 and 7. The clamping spider 60 is also symmetrical about a central axis and includes a flat hub portion 62 and three equally spaced apart leg portions 64 extending radially outwardly of the hub portion. The leg portions 64 each terminate at its radially outer end in an axially extending projection 66 which terminates in a hook portion 70. Each of the leg portions 64 has a radial slot 72 therein to impart, along with the relatively thin cross-section of the leg portion, a small amount of axial flexibility to the leg portion 64 and to facilitate molding of the hook portion 70. Similarly, the axially extending projection 66 is provided with a certain amount of radial flexibility for reasons which will become apparent. Each of the leg portions 64 is also provided with a pair of support elements 76 extending axially therefrom as best illustrated by FIG. 3. The support elements 76 are disposed, as best shown by FIGS. 3 and 4, in a circular array having approximately the same diameter as the node ring "NR", and the annular ridge 32 of the support members 30, the inside diameter of the circular array of support elements 76 being just slightly larger than the diameter "d" of the ceramic disc 12.

Additional important dimensional relationships are illustrated by FIG. 3. As shown, the inner diameter of the axial projections 66 is substantially equal to the outer diameter of the annular peripheral edge 50 of the support member 30. The axial lengths of the support elements 76 and the projections 66 are selected such that the diaphragm 10 is firmly held between the annular ridge 32 and the support elements 76 when the hooks 70 engage the annular surface 36 of the support element 30. More particularly, the lengths of the support elements 76 and the projections 66 are selected such that the radially extending leg portions outwardly of the support elements 76 are resiliently deflected axially toward the diaphragm 10 when the hook portions are engaging the annular surface 36. Still referring to FIG. 3, the hook portions 70 have cam surfaces 80 thereon disposed in a circular array of substantially the same diameter as that of the annular cam surface 34.

Figure 7:
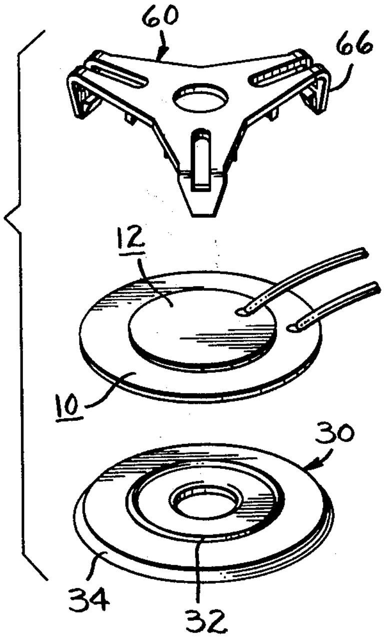
FIG. 7 is an exploded view of the elements of the piezoelectric transducer assembly of FIGS. 1-3.

The unique, rapid and accurate assembly of the sound generating device of this invention will now be described with particular reference to FIGS. 3 and 7. The diaphragm 10 is positioned between the support member 30 and the clamping spider 60 with the elements arranged such that the annular ridge 32 and the support elements 76 face each other on opposite sides of the diaphragm 10. The diaphragm 10 is preferably positioned with the ceramic disc 12 axially facing the clamping spider 60, but the disc 12 could if desired for any reason face the support member 30. The clamping spider 60 and the support member 30 are then moved axially toward each other until the cam surfaces 80 and 34 contact each other. Continued axial movement of the clamping spider relative to the support member 30 causes the cam surface 34 to bias the axial projections 66 radially outwardly to permit the hook portions 70 to slide radially outwardly of the annular lip 50 and thereafter to snap radially inwardly into engagement with the surface 36 on the side of the support member 30 away from the diaphragm 10. As the hook portions 70 are forced over the annular lip 50, the radially outer ends of the leg portions 64 of the spider 60 are resiliently deflected toward the diaphragm 10 and the support member 30.

Since the diameter "d" of the piezoelectric ceramic disc 12 is only slightly smaller than the inner diameter of the annular array of support elements 76, the diaphragm 10 becomes readily centered on axis 13 with respect to the clamping spider 60, i.e., the disc 12 merely slips inside of the axially extending support elements 76 as best shown by FIG. 3. Since the diameter of the annular lip 50 of the support member 30 is substantially identical to the inside diameter of the axial projections 66 of the clamping spider, the assembly process also assures that the support member 30 and clamping spider 60 are coaxially aligned on the axis 13. As a result of the coaxial alignment of the three major elements, i.e., the support member 30, the diaphragm 10 and the clamping spider 60, the node ring "NR" of the diaphragm 10, the annular ridge 32 and the support elements 76 are also coaxially aligned with each other not only during the assembly process, but also maintained without being able to shift from this position during use. Since the annular ridge 32 and the annular array of support elements 76 have substantially the same diameter as the node ring "NR," the diaphragm 10 is therefore securely mounted on its node ring "NR" between the annular ridge 32 and the support elements 76. For proper alignment, it is important that the diameter of the disc 12 be as large as possible relative to the inner diameter of the support elements 76 without, however, being large enough to interfere with the disc 12 fitting inside of the support elements 76. The resilient deflections of the outer ends of the leg portions 64 of the spider toward the diaphragm 10 assures that the node ring "NR" is held firmly in a fixed position while the remainder of the diaphragm 10 is left free to vibrate and produce sound in response to appropriate voltage inputs on leads 16 and 20 to the piezoelectric element 12.

From the foregoing, it will be seen that the mounting arrangement of this invention facilitates the rapid and accurate assembly of a piezoelectric transducer. More particularly, the invention provides a highly accurate and simple mounting which permits the precise initial and permanent positioning and mounting of a vibrating transducer element on a desired node ring.

While the invention has been particularly shown and described with reference to a preferred embodiment thereof, it will be understood by those skilled in the art that various changes in form, details, and application may be made therein without departing from the spirit and scope of the invention. Accordingly, it is intended that all such modifications and changes be included within the scope of the appended claims.

What is claimed as new and is desired to secure by Letters Patent of the United States is:

1. A sound generating device comprising:
- a flexible diaphragm having a central axis,
- a substantially rigid support member axially located on a first side of said diaphragm, said support member having an annular ridge projecting axially therefrom into contact with said diaphragm, the diameter of said annular ridge being equal to the diameter of a node circle of vibration of said diaphragm,
- a clamping spider axially located on a second side of said diaphragm, said clamping spider having a hub portion and a plurality of resilient leg portions extending radially outwardly of said hub portion, each of said leg portions having at least one support element projecting axially therefrom into contact with said diaphragm, said support elements being disposed in a circular array having the same diameter as said annular ridge,
- means interconnecting said support members and each of said leg portions radially outwardly of said diaphragm, said interconnecting means resiliently biasing said leg portions toward said diaphragm such that said diaphragm is supported between said annular ridge and said support elements, and
- means for vibrating said diaphragm to produce sound, said means for vibrating said diaphragm comprising a piezoelectric electromechanical transducing element coaxially attached to said diaphragm and projecting axially therefrom toward a selected one of said support member and said clamping spider, said piezoelectric element having a circular periphery of a diameter to closely fit within the inner diameter of the facing one of said annular ridge and said array of support elements, whereby assembly of the sound generating device with said piezoelectric element located within the respective one of said annular ridge and said group of support elements assures that said diaphragm is clamped between said support member and said clamping spider on said node circle of vibration of said diaphragm.

2. A sound generating device as claimed by claim 1 in which:
- said interconnecting means includes an axially extending resilient projection on the radially outer end of each of said leg portions, said resilient projection terminating in a hook portion,
- said support member includes a mating surface for engaging each said hook portion, and
- the length of said resilient projections being such that said leg portions are resiliently deflected toward said diaphragm and said support member when said hook portions engage said mating surface.

3. A sound generating device as claimed by claim 2 in which:

said mating surface is a peripheral annular surface axially facing away from said diaphragm and said clamping spider, and said hook portions extend radially inward of the periphery of said support member to contact said mating surface.

4. A sound generating device as claimed by claim 3 further comprising a peripheral annular cam surface on said support member axially facing said diaphragm and said clamping spider, said hook portions having complementary cam surfaces thereon disposed in a circular array of substantially the same diameter on said annular cam surface, said annular cam surface and said complementary cam surfaces disposed so as to facilitate assembly of the sound generating device.

* * * * *